SUBSTRATES HAVING SOLDERABLE GOLD FILMS FORMED THEREON, AND METHODS OF MAKING THE SAME

Filed June 30, 1961

INVENTOR.
W. R. McCORMACK
BY H. J. Winegar
ATTORNEY

United States Patent Office 3,207,838 Patented Sept. 21, 1965

3,207,838

SUBSTRATES HAVING SOLDERABLE GOLD FILMS FORMED THEREON, AND METHODS OF MAKING THE SAME

Walter R. McCormack, Levittown, Pa., assignor to Western Electric Company, Incorporated, New York, N.Y., a corporation of New York Filed June 30, 1961, Ser. No. 121,236
7 Claims. (Cl. 174—68.5)

This invention relates to substrates having solderable gold films formed thereon, and methods of making the same. More particularly, this invention relates to glass substrates having gold films fired thereon and leads soldered thereto, and methods of making the same.

In the past, glass and ceramic articles have been decorated with gold designs by applying any of a variety of gold-containing compositions thereto and subsequently firing the articles to fix metallic gold films thereon in accordance with a desired design. The gold films so produced are often referred to as "fired-on," and the processes so used are often referred to as methods for "firing-on" gold. These decorating techniques have become highly refined so that it is possible to produce fired-on films in highly accurate, complex, precise, and reproducible patterns.

Although it is known that solder may be applied to metallic gold, solder may not be applied to fired-on gold films produced according to conventional decorating techniques. Therefore, in order to attach solderable elements to such films, it has been the practice to specially treat fired-on gold films to render them solderable, as by coating such films with platinum or by using special gold-doped solders and/or special fluxes. This special preparation involves considerable expense and effort, and renders the use of soldering techniques with fired-on gold films impractical or uneconomical for many purposes.

Due to the electrical properties of gold and the strong adhesive force between a fired gold film and a glass substrate to which it is applied, it is highly desirable to employ techniques analogous to known gold-decorating techniques in the thin-film and printed circuitry arts. More particularly, such a gold film fired on a substrate may conveniently be used in these arts to interconnect circuit elements, provide circuit conductors, and to provide suitable areas for attachment of connections and leads to such circuitry. However, despite the desirability of using fired-on gold for such purposes, the difficulty and expense in attaching various elements, such as leads or the like, to fired-on gold films heretofore has rendered use of such films for printed or thin-film circuitry purposes impractical.

It is an object of this invention to provide novel substrates having solderable gold films thereon.

Another object of this invention is to provide a novel method of forming gold films on substrates to render the gold films solderable.

A further object of this invention is to provide glass substrates having gold films fired thereon to which elements are soldered.

Broadly, these objects are achieved in accordance with inventive methods which may include the steps of applying a gold-containing composition to a glass substrate in a desired pattern, and heating the substrate in acordance with a predetermined firing schedule.

Novel articles of manufacture embodying useful aspects of the invention may include a glass substrate having a solderable gold film fired thereon. Such novel articles may also include an element attached thereto with solder.

As will be more clearly understood from reading the following detailed description, methods embodying aspects of this invention may be practiced in conjunction with a wide range of materials.

In general, gold-containing compositions which are useful in providing fired-on metallic gold films on substrates for decorative purposes may also be used in the practice of this invention. Commonly, these compositions take the form of mixtures, solutions, colloidal suspensions, and pastes. Such compositions usually contain organic gold compounds, together with viscosifiers, solvents, fluxes, and perhaps dyes.

The organic gold compounds used in these gold-containing compositions often take the form of a resinous gold compound obtained by reacting inorganic gold compounds, such as gold chloride, potassium chloraurate, or the like, with organic materials, such as terpene sulfide, terpene mercaptan or the like. For the most part, these organic gold compounds are produced by means of complicated, little understood, chemical processes involving reacting such starting materials as gold chloride and terpene sulfide, and then dissolving, precipitating, filtering and collecting to obtain a resinous gold compound.

An example of a suitable resinous gold compound, which may be used in practicing this invention, is that obtained by reacting aqueous solution of gold chloride, $AuCl_3$, with alpha-pinene mercaptan, as disclosed in Ballard Patent 2,490,399. Another example of a suitable gold-containing composition, also disclosed in the Ballard patent, is the reaction product of a solution of aqueous gold chloride and beta-pinene mercaptan.

It is common to add various amounts of solvents and viscosifiers to the organic gold compounds in order to control the thickness or viscosity of the resulting composition and make them suitable for a particular method of application. Solvents used heretofore in gold-decorating compositions are suitable for use in gold-containing compositions to obtain fired-on gold films in accordance with this invention. In particular, lavender oil, rosemary oil, anethole, fennel oil, methyl salicylate, nitrotoluene, various terpenes and hydrocarbon solvents such as cxlene, toluene, benzene, kerosene, and the like, are effective solvents or diluents.

An example of a suitable solvent comprises the following in the proportions set forth:

*Solvent A*

| | Parts |
|---|---|
| Ortho nitrotoluene | 40 |
| Methyl salicylate | 25 |
| Anethole | 15 |
| Benzyl alcohol | 20 |
| Total | 100 |

Another suitable solvent contains the following:

*Solvent B*

| | Parts |
|---|---|
| Synthetic camphor | 15 |
| Cineol | 25 |
| Ortho nitrotoluene | 30 |
| Spike lavender oil | 10 |
| Monochlorobenzene | 20 |
| Total | 100 |

Viscosifying agents, such as pine rosin or a mixture of pine rosin and sulfur, used in the gold decorating art are suitable for controlling the viscosity or a thickness of the resinous gold compounds. An example of an effective viscosifying agent is as follows:

*Viscosifying agent A*

| | Parts |
|---|---|
| Pine rosin | 90 |
| Flowers of sulfur | 10 |
| Total | 100 |

Fluxes are usually included in these gold containing compositions to promote gold film-substrate adhesion. A range of materials may be used as fluxes, among which are chloride compounds of bismuth, chromium, vanadium, tin and rhodium. Glass frits may also be used to enhance adhesion of the gold films to the substrate. The fluxes commonaly make up from a fraction of a percent to 5% of the gold-containing compositions.

In general, any of the fluxes heretofore used in gold-decorating compositions are satisfactory for use in gold-containing compositions in accordance with this invention.

The following examples illustrate flux compositions which may be added to resinous gold compounds to promote adhesion:

*Flux A*

| | Parts |
|---|---|
| Bismuth trichloride | 5 |
| Ethylene chlorohydrin | 94 |
| Hydrochloric acid (conc.) | 1 |
| Total | 100 |

*Flux B*

| | |
|---|---|
| Rhodium chloride | 40 |
| Methanol | 60 |
| Total | 100 |

*Flux C*

This flux may be prepared by weighing into a 2-liter beaker:

| | Grams |
|---|---|
| Pine rosin | 3.4 |
| Cyclohexanol | 50.9 |
| Oil of cloves | 12.6 |
| Rosemary oil | 12.7 |
| Spike lavender oil | 3.4 |
| The resulting mixture is dissolved by stirring, and then it is added dropwise to silicon tetrachloride | 17.0 |
| Total | 100 |

The mass is heated to 120° C. to 130° C. for a sufficient period of time to evaporate the 100-gram batch to a net weight of 30 grams.

The following is a representative breakdown of the constituents of typical gold-containing compositions which are useful in practicing this invention.

| | Percent |
|---|---|
| Resinous gold compound | 20–25 |
| Viscosifier | 20–25 |
| Solvent | 50 |
| Fluxes | 2.5–5 |

Several specific examples of gold-containing compositions which may be used to practice this invention are as follows:

*Gold-containing composition A*

| | Parts |
|---|---|
| Resinous gold compound obtained by reacting aqueous gold chloride with alpha-pinene mercaptan | 22.0 |
| Viscosifying agent A | 20.8 |
| Solvent B | 53.4 |
| Flux A | 3.0 |
| Flux B | 0.3 |
| Flux C | 0.5 |
| Total | 100 |

*Gold-containing composition B*

| | |
|---|---|
| Resinous gold compounds used in gold-containing composition A | 28.0 |
| Pine rosin | 18.8 |
| Turpentine | 50.4 |
| Flux A | 2.0 |
| Flux B | 0.3 |
| Flux C | 0.5 |
| Total | 100 |

As used herein, the term "gold-containing composition" includes the reaction product of an inorganic gold compound, such as gold chloride or potassium chloraurate, and an organic material, such as terpene sulfide or terpene mercaptan, and may additionally include fluxes, solvents and viscosifiers.

These gold-containing compositions which are useful in providing fired-on gold films are commercially available. For example, E. I. du Pont de Nemours & Co., Inc., sells compositions of this nature under the idenification names and numbers Liquid Bright Gold #5300, Liquid Bright Gold #4063, and Squeegee Bright Gold #6846. The Hanovia Liquid Gold Division of Engelhard Industries, Inc., sells gold-containing compositions under the identification names and numbers Liquid Bright Gold #1261 and Squeegee Bright Gold #4944.

It should be understood that the practice of this invention is not limited to the use of any particular gold-containing composition. Tests have clearly established that the amounts of organic gold compound, metallic gold, viscosifiers and solvents, and the amounts and types of fluxes, are not critical insofar as the successful practice of this invention is concerned. This is believed to be explainable by the fact that the firing of these gold-containing compositions results in the decomposition of the resinous gold compound into elemental gold and organic materials. The organic materials are driven off in the firing of these compositions, probably with a concomitant decomposition of some or all of the organic constituent, leaving a deposit of finely divided metallic gold and small quantities of fluxes on the surface of the substrate. Typically the driving off of the organic materials occurs at a temperature of about 600° F., which is well below those used for firing in accordance with this invention.

A wide range of materials is suitable for use as a substrate in the practice of this invention. In general, materials which have characteristics of glass and are capable of receiving a fired-on gold film are appropriate substrates for the practice of this invention. More particularly, lime and flint glass, heat-resisting glass, including that sold under the trademark "Pyrex," are suitable substrates. The particular substarate selected for the practice of this invention is generally dependent upon the characteristics desired in the ultimate product. For example, if a high degree of resistance to thermal shock is desired in the ultimate product, heat-resisting glass, such as "Pyrex," might be used for the substarate. It is believed that a wide range of ceramics would also be suitable as substrates. The methods according to this invention may also be practiced with a wide range of solders and soldering fluxes, if fluxes are used.

A complete understanding of this invention may be obtained from the following detailed description, when read in conjunction with the appended drawing, wherein.

Figures 1, 2:
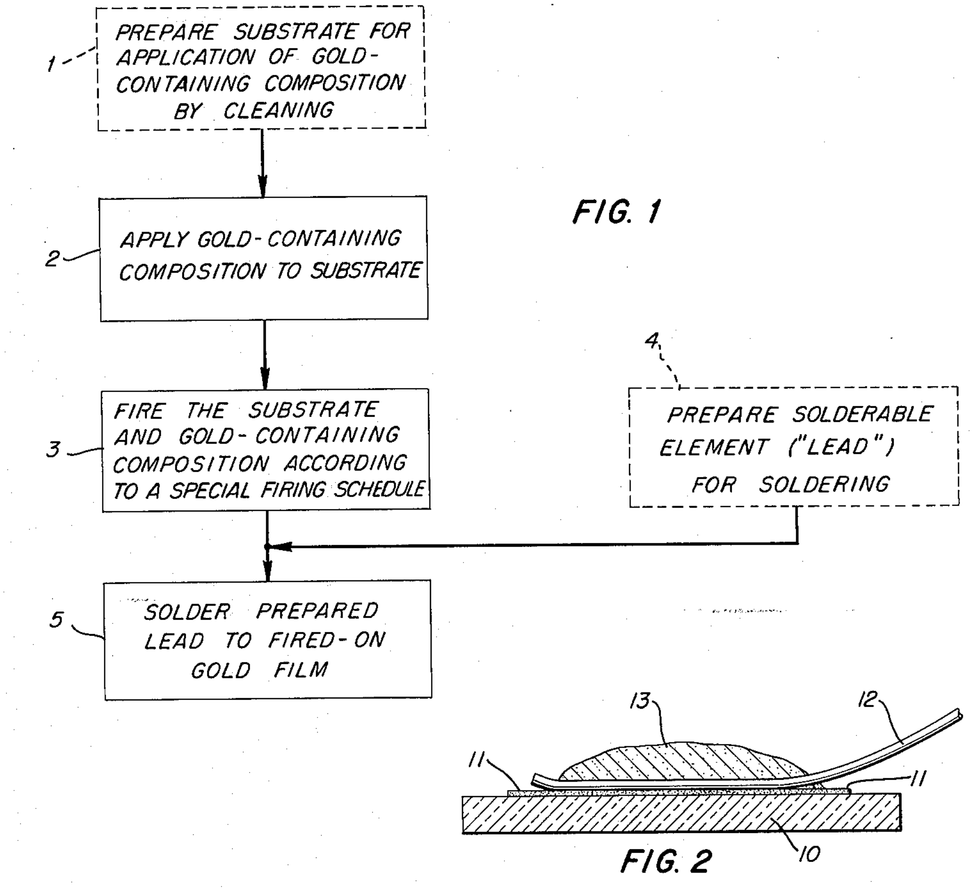
FIG. 1 is a flow chart illustrating steps of a preferred method in accordance with this invention.
FIG. 2 is a side view in partial cross-section of an article of manufacture produced in accordance with methods embodying the invention.

Referring to FIG. 1, a preliminary step of a method in accordance with this invention is represented by block 1, and includes preparing a substrate of suitable material for receiving an application of a particular gold-containing composition. This step usually involves a careful cleaning of the substrate surface. For example, such substrate cleaning may be effected by a thorough scrubbing with a detergent, followed by a rinsing with distilled water. In general, any of the many prior-art procedures used in preparing substrates for the application of fired-on gold may be used in the performance of this step.

The practice of the preferred method, according to this invention, does not necessarily depend upon any specific cleaning procedure and may be practiced with substrates of materials requiring little or no preparation.

As indicated in block 2 (FIG. 1), the prepared substrate is subjected to an application of a gold containing composition. This application may be in any desired pattern, arrangement, or form on the surface of the substrate and may be accomplished, for example, by brushing, spraying, silk screening, or any of the various ways in which gold compositions are applied to substrates in decorative processes. The method of application of the gold-containing composition will, of course, depend upon the ultimate requirements of the desired product. Any means for or methods of applying the gold-containing composition to the surface of the substrate in a desired pattern is within the purview of the invention.

The quantity of the gold-containing composition applied will have a bearing on the thickness of the gold film which is ultimately fired onto the substrate. However, the thickness of this film is not too critical to the practice of the methods of this invention. A range of thickness from about 1000 angstroms up to about 5000 angstroms has proved quite satisfactory.

As indicated in block 3 (FIG. 1), the substrate having an application of the gold-containing composition thereon is fired. This serves to decompose, volatilize and/or drive off the organic constituents of the gold containing composition, and to deposit and fix a pattern of metallic gold on the substrate. Fuxes in small amounts suitable for promoting gold film-substrate adhesion may also remain in this deposit.

The firing time and temperature must be sufficient to remove the various organic constituents so as to leave a firmly adhering deposit of metallic gold on the surface of the substrate. On the other hand, the firing temperature and time must not be so great as to cause a diffusion and mixing of the deposited gold and the substrate material. Such diffusion and mixing of the gold and the substrate produces a fired-on film having a discontinuous and rough surface which is not readily solderable and possesses lower electrical conductivity than does a film of gold that is not diffused into the substrate. As used herein, the term "solderable gold film" refers to a gold film which does not require a preliminary coating with a metal such as platinum to permit soldering.

Conventional temperature ranges used in firing gold-containing compositions on a particular substrate for decorative purposes are too high to produce gold films that are directly solderable. If the temperature ranges of the gold-decorating art are used, the resulting gold films must first be coated with a metal, such as platinum, in order to permit soldering of elements to the gold films. However, by employing temperatures substantially below those used in the prior-art decorative techniques and which are well below the softening point of the substrate, gold films are produced which are highly adherent to the substrate and are not diffused in the substrate. These films may be soldered directly without a prior application of a metal, such as platinum.

As an example of the prior art, one manufacturer recommends, for a number of gold-containing compositions in solution, a firing temperature which is substantially at the softening point of the particular substrate to which it is desired to fire on a gold film. As a further example of the prior art, the Ballard patent indicates a firing range of only 20° C. to 30° C. below the softening point of the particular glassware. If this glassware were lime glass having a softening point of 1150° F., such a suggested firing range on the Fahrenheit scale would be only from 36° F. to 54° F. below the softening point of such lime glass. These temperature ranges have proved unsatisfactory because they produce discontinuous gold films which are not directly solderable.

However, when such gold-containing compositions are fired on a glass substrate at a temperature from about 150° F. to about 350° F. below the softening point of the particular glass substrate, an adherent, directly solderable gold film is obtained. Firing temperatures of from about 150° F. to about 250° F. below the softening point of a variety of glass materials have proved highly satisfactory. The range of from 150° F. to 200° F. below the softening point of lime glass has proved highly efficacious for such glass from the standpoint of producing highly adherent, durable, yet directly solderable fired-on gold films. Thus, lime glass having a softening point of about 1150° F. would be fired at temperatures in the range of from about 800° F. to about 1000° F.

For heat-resisting glass, such as "Pyrex" or the like, temperatures above those used for a lime glass and yet well below those at which such heat-resisting glass softens are required to obtain a highly adherent, yet solderable, fired-on gold film. In particular, temperatures in the range of from about 150° F. to about 350° F. below the softening point of "Pyrex" glass have proved well suited for firing gold films on such glass. Thus, "Pyrex" glass having a softening point of about 1400° F. would be fired at temperatures in the range of from about 1050° F. to about 1250° F.

The firing time must be sufficiently long to decompose and volatilize the organic ingredient of the gold-containing composition, and yet not so great as to cause substantial diffusion. Satisfactory solderable gold films have been produced with firing times as little as one-half hour. On the other hand, firing times of two or three hours have also yielded readily solderable gold films. Firing times substantially less than one-half hour at relatively low temperatures result in poor adhesion of the gold films to glass and ceramic substrates, while firing times greater than about three hours and at relatively high temperatures may produce discontinuous and unsolderable fired-on films.

As indicated in block 4 (FIG. 1), solderable elements are prepared for soldering in accordance with usual procedures which will depend upon the composition of the selected solderable element, and the solder and flux being employed. As is known, such procedures may include mechanical cleaning, such as by brushing, scraping or chemical cleaning. If desired, the element may be tinned. For purposes of describing this invention, it need only be understood that the solderable element is suitably prepared for soldering with the particular solder being employed.

The practice of the preferred methods according to this invention does not necessarily depend upon any specific procedure for preparing the leading for soldering, and may be practiced with leads having had little or no preparation. For convenience, the above-discussed solderable element will be referred to herein as a "lead" and, if prepared for soldering as described, a "prepared lead."

As indicated in block 5 (FIG. 1) a prepared or unprepared lead is soldered to the fired-on gold film by conventional means. However, a particularly advantageous method of soldering includes heating the lead in the vicinity of the bonding spot and permitting it, in turn, to transmit soldering heat to itself, the solder and the gold film at the selected bonding spot. Application of a common soldering iron to the lead near the bonding spot will work quite satisfactorily. However, it is to be understood that the successful practice of the invention is not limited to any particular soldering method.

Additionally, it is to be understood that methods according to this invention do not require any particular solder or soldering flux. In general, any solder and soldering flux combination which could be used to solder a prepared lead to metallic gold (not in the form of fired-on gold) may be employed in practicing this soldering step. Tin-lead solders containing from 30% to 60% tin, and various indium-tin solders have been successfully used in accordance with the invention in soldering leads to fired-on gold films.

It is well known that gold is soluble to some extent in molten solders of most compositions. In practicing this method step, care shuold be taken to avoid maintaining the solder in molten condition sufficiently long to permit the solder to absorb the film of fired-on gold. Obviously, the thinner the gold film and the greater the gold-absorbing capacity of the solder, the greater the care which must be exercised in this regard. Tests have proven, however, that extremely thin fired-on gold films, on the order of 1000 angstroms thick, may be soldered with the solders in common industrial use held molten for extended, industrially practical periods.

As indicated above, the flux employed in soldering to fired-on gold films will depend upon the composition of the selected lead and the selected solder. Criteria for selecting solder and flux combinations are well known to these skilled in the art and the successful practice of this invention is not dependent upon the use or non-use of a soldering flux or upon the use of any particular soldering flux if a flux is used.

Referring to FIG. 2, there is shown an article produced by the above-described method and including a substrate 10 having a fired-on gold film 11 firmly adhered to the surface thereof. A solderable element, for example a lead 12, is attached to a fired-on gold film 11 by means of a solder 13.

Figure 3:
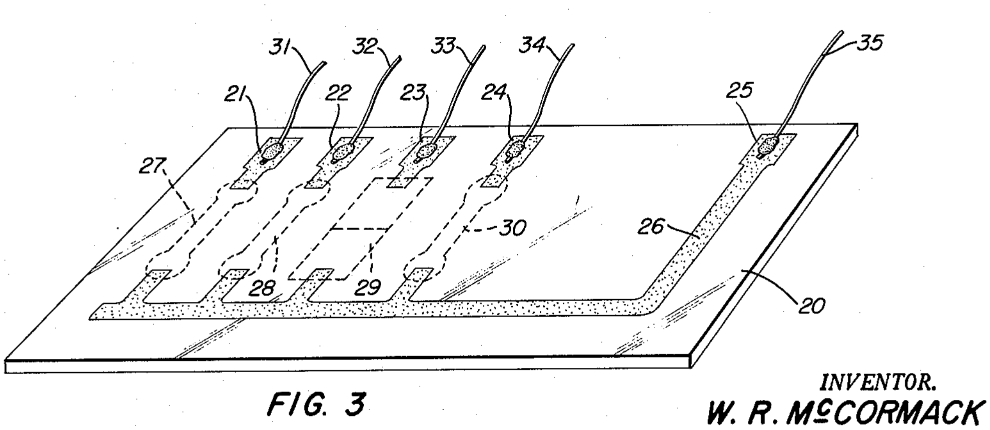
FIG. 3 is a perspective view of a novel printed circuit board produced in accordance with methods embodying the invention.

FIG. 3 illustrates a circuit board including a substrate 20 on which gold tabs 21–25 and a conductor pattern 26 have been fired-on in accordance with a method embodying this invention. Printed, thin-film, or other circuit elements shown by phantom lines, such as elements 27–30, may be arranged in contact with such tabs and circuit pattern in accordance with any desired circuit arrangement. Specifically, the elements 27, 28 and 30 may be thin film resistors, while the element 29 may be a thin film capacitor. To each of tabs 21–25 is soldered a lead 31–35, respectively, in accordance with methods embodying this invention.

It will be apparent from this illustration that a wide range of from simple to highly complex gold circuitries may be fired on the surface of a substrate in accordance with this invention. The refinements in the art of producing decorative fired-on gold films may be employed to produce accurate, highly reproducible circuit patterns. A solder bond embodying the invention, and produced in accordance with methods embodying the invention, is mechanically strong, low in electrical resistance, and generally highly satisfactory for electrical circuitry purposes.

Typical examples are shown below in tabular form of gold-containing compositions, including some which are commercially available that have been applied to various substrates which typify materials having characteristics of glass and are capable of receiving fired-on gold films. Such compositions have been fired to produce adherent gold films. To these films copper leads have been soldered, and the bonds formed thereby subjected to destructive tests. These tests involved applying tension to the leads at shock speeds of 20 inches per minute while holding the substrate stationary. Since the lead or substrate broke in each of these tests while the bond stayed intact, the bond strength was great compared with the lead or substrate strength.

| Example | Substrate | Gold-containing composition | Softening point of substrate, ° F. | Firing schedule, ° F. | Lead (tinned Cu.) | | Solder and flux |
|---|---|---|---|---|---|---|---|
| | | | | | Gauge (A.W.G.) | Approx. breaking strength of lead, lbs. | |
| I | Lime glass | Gold-containing composition A. | 1,150 | 950–1,000 for 2 hours. | #19 | 32 | 45–55 Sn-Pb rosin core. |
| II | Heat resisting glass ("Pyrex"). | Gold-containing composition B. | 1,400 | 1,050–1,250 for 2 hours. | #19 | 32 | Do. |
| III | do | Liquid Bright Gold #1261.[1] | 1,150 | 950–1,000 for 2 hours. | #19 | 32 | Do. |
| IV | do | Squeegee Bright Gold #4944.[1] | 1,150 | do | #19 | 32 | Do. |
| V | do | Squeegee Bright Gold #6846.[2] | 1,150 | do | #19 | 32 | Do. |

[1] Product of Hanovia Liquid Gold Division of Engelhard Industries, Inc.
[2] Product of E. I. du Pont de Nemours & Co., Inc.

It should be understood that the above-described embodiments of this invention are merely illustrative and that numerous modifications may be made within the spirit and scope of this invention.

What is claimed is:

1. The method of forming a solderable gold film on a glass substrate with a gold-containing composition capable of being decomposed by heat into elemental gold and organic materials which composition is suitable for forming an adherent gold film to the substrate by firing techniques, which comprises applying to the glass substrate the gold-containing composition, and firing the composition at a temperature between 150° F. and 350° F. below the softening point of said glass and for a period of from one-half hour to three hours to decompose the gold-containing composition and drive off the organic materials so that said solderable gold film is formed on the substrate without substantial diffusion of the gold into the substrate.

2. The method in accordance with claim 1 wherein the glass substrate is lime glass and the firing is accomplished at a temperature between 150° F. and 200° F. below the softening point of said glass for substantially two hours.

3. The method in accordance with claim 1 wherein the glass substrate is a heat-resisting glass and the firing is for a period of two hours.

4. The method of soldering an element to a solderable gold film which comprises applying to a glass substrate a gold-containing composition capable of being decomposed into elemental gold and organic materials by firing techniques to form an adherent gold film, firing the composition at a temperature between 150° F. and 350° F. below the softening point of said glass and for a period of one-half hour to three hours for decomposing the gold-containing composition to drive off the organic materials and to form said solderable gold film on the substrate without substantial diffusion of the gold into the substrate, and soldering the element directly to the resulting solderable gold film.

5. The method in accordance with claim 4 wherein the glass substrate is lime glass and the firing is accomplished at a temperature between 150° F. and 200° F. below the softening point of said glass for substantially two hours.

6. The method in accordance with claim 4 wherein the glass substrate is a heat-resisting glass and the firing is accomplished for a period of two hours.

7. A printed circuit board which comprises a glass substrate, an electrically conductive, solderable gold film formed on said substrate by applying a gold-containing composition onto said substrate which composition is capable of being decomposed into elemental gold and organic materials by firing techniques to form an adherent gold film on the substrate and firing the composition at a temperature between 150° F. and 350° F. below the softening point of said glass for a period of from one-half hour to three hours, and a lead soldered to said solderable gold film.

References Cited by the Examiner

UNITED STATES PATENTS

| | | | |
|---|---|---|---|
| 299,148 | 5/84 | Koken | 117—124 X |
| 507,890 | 10/93 | Doulton et al. | 29—473.1 |
| 2,171,086 | 8/39 | Gibson | 117—124 X |
| 2,490,399 | 12/49 | Ballard | 106—287 X |
| 2,610,126 | 9/52 | Kerridge et al. | 117—124 X |
| 2,730,598 | 1/56 | Lytle. | |
| 2,842,457 | 7/58 | Morgan et al. | |
| 3,041,710 | 7/62 | Geer | 29—195 |
| 3,077,511 | 2/63 | Bohrer | 29—155.5 X |

JOHN F. CAMPBELL, *Primary Examiner.*

JOHN P. WILDMAN, *Examiner.*

UNITED STATES PATENT OFFICE

CERTIFICATE OF CORRECTION

Patent No. 3,207,838 September 21, 1965

Walter R. McCormack

It is hereby certified that error appears in the above numbered patent requiring correction and that the said Letters Patent should read as corrected below.

Column 4, line 21, for "chloraurate" read -- chloroaurate --; lines 60 and 65, for "substarate", each occurrence, read -- substrate --; column 5, line 47, for "Fuxes" read -- Fluxes --; column 6, line 68, for "leading" read -- lead --; column 7, line 51, for "these" read -- those --; columns 7 and 8, in the table, second column, line 4 thereof, for "do" read -- Lime glass --.

Signed and sealed this 17th day of May 1966.

(SEAL)

Attest:

ERNEST W. SWIDER
Attesting Officer

EDWARD J. BRENNER
Commissioner of Patents